(12) United States Patent
Chang

(10) Patent No.: US 7,592,937 B1
(45) Date of Patent: Sep. 22, 2009

(54) CABAC DECODING UNIT AND METHOD

(75) Inventor: Yung-Chang Chang, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/131,208

(22) Filed: Jun. 2, 2008

(51) Int. Cl.
*H03M 7/00* (2006.01)

(52) U.S. Cl. .................. 341/107; 375/240.16; 370/202; 708/490

(58) Field of Classification Search ......... 341/105–110; 375/241.16, E7.09, E7.144, E7.176, E7.181, 375/E7.161; 370/202; 709/490
See application file for complete search history.

(56) References Cited

U.S. PATENT DOCUMENTS

| 7,262,722 | B1 * | 8/2007 | Jahanghir et al. | 341/107 |
| 7,292,165 | B2 * | 11/2007 | Cha et al. | 341/107 |
| 7,365,660 | B2 * | 4/2008 | Park et al. | 341/107 |
| 7,385,535 | B2 * | 6/2008 | Yang et al. | 341/107 |
| 7,408,487 | B2 * | 8/2008 | Cho | 341/107 |
| 7,423,562 | B2 * | 9/2008 | Kim et al. | 341/67 |
| 7,460,042 | B2 * | 12/2008 | Oshikiri et al. | 341/107 |
| 2007/0080832 | A1 * | 4/2007 | Yang et al. | 341/50 |
| 2008/0001796 | A1 * | 1/2008 | Oshikiri et al. | 341/107 |
| 2008/0246637 | A1 * | 10/2008 | Chen et al. | 341/51 |

OTHER PUBLICATIONS

"A High Performance CABAC Decoding Architecture" Yu Wei et al, IEEE Transactions on Consumer Electronics, vol. 51, No. 4, Nov. 2005.
"High-Throughput Architecture for H.264/AVC CABAC Compression System" Osorio Roberto R. et al, IEEE Transactions on Circuits and Systems for Video Technology, vol. 6, No. 11. Nov. 2006.

* cited by examiner

*Primary Examiner*—Lam T Mai
(74) *Attorney, Agent, or Firm*—Thomas, Kayden, Horstemeyer & Risley

(57) ABSTRACT

A context-based adaptive binary arithmetic coding (CABAC) method. The CABAC method for a bitstream comprises: detecting a control signal (Sig_first); decoding a first bin representing one of a first coefficient flag (Sig) and a second coefficient flag (Last) from the bitstream according to the control signal (Sig_first); decoding a second bin representing one of the second coefficient flag (Last) and a next first coefficient flag (Sig) from the bitstream according to the decoded first bin and the control signal (Sig_first); and updating the control signal (Sig_first) according to the decoded first and second bins. The first and second bins are decoded in one clock cycle, the first coefficient flag (Sig) indicates whether a corresponding coefficient value is zero, and the second coefficient flag (Last) indicates whether a coefficient map decoding process is finished.

21 Claims, 4 Drawing Sheets

CABAC DECODING UNIT AND METHOD

CROSS REFERENCE TO RELATED APPLICATIONS

This application is related to co-pending U.S. utility application Ser. No. 12/131,245, filed on Jun. 2, 2008, entitled CABAC encoder and CABAC encoding method, the entirety of which is incorporated herein by reference.

BACKGROUND OF THE INVENTION

1. Field of the Invention

The invention relates to a decoding method, and in particular relates to a CABAC decoding method.

2. Description of the Related Art

The new H.264/AVC video coding standard provides a significant compression gain over previous standards. H.264/MPEG-4 AVC is a recent video coding standard that makes use of several advanced video coding tools to provide better compression performance than existing video coding standards such as, MPEG-2 and H.263.

A context-based adaptive binary arithmetic coding (CABAC) has been adopted as a normative part of the H.264/MPEG-4 Advanced Video Coding (AVC) standard. It is one of two alternative methods of entropy coding in the H.264/AVC standard. The other method specified in H.264/AVC is a low-complexity entropy-coding technique based on the usage of context-adaptively switched sets of variable-length codes, so-called Context-Adaptive Variable-Length Coding (CAVLC). Compared to CABAC, CAVLC offers reduced implementation costs at the price of lower compression efficiency. Thus, for TV signals in standard-definition or high-definition resolution, CABAC typically provides bit-rate savings of 10-20% relative to CAVLC at the same objective video quality.

CABAC involves three key elements: 1) binarization of the input symbol stream to yield a stream of binary symbols (bins); 2) context modeling (conditional probability that a bin is 0 or 1 depending on previous bin values); and 3) binary arithmetic coding (recursive interval subdivision with subdivision according to conditional probability).

However, the computational complexity of the CABAC of H.264/AVC video coding standard is a problem. The complexity of the CABAC of H.264/AVC video coding standard increases probability that the encoding speed and decoding speed is hindered. One conventional approach to the problem includes running the encoding/decoding hardware at a high frequency to handle the computational complexity problem. But, the disadvantage of the conventional approach is to raise the operational frequency of the corresponding hardware. Thus, improving CABAC decoding efficiency without raising the operational frequency of the corresponding hardware is desired.

BRIEF SUMMARY OF THE INVENTION

A detailed description is given in the following embodiments with reference to the accompanying drawings.

An embodiment of a context-based adaptive binary arithmetic coding (CABAC) for a bitstream is provided. The method comprises: detecting a control signal (Sig_first); decoding a first bin representing one of a first coefficient flag (Sig) and a second coefficient flag (Last) from the bitstream according to the control signal (Sig_first); decoding a second bin representing one of the second coefficient flag (Last) and a next first coefficient flag (Sig) from the bitstream according to the decoded first bin and the control signal (Sig_first); and updating the control signal (Sig_first) according to the decoded first and second bins. The first and second bins are decoded in one clock cycle, the first coefficient flag (Sig) indicates whether a corresponding coefficient value is zero, and the second coefficient flag (Last) indicates whether a coefficient map decoding process is finished.

Another embodiment of a context-based adaptive binary arithmetic coding (CABAC) decoding unit for a bitstream is provided. The CABAC decoding unit comprises a first decoder and a second decoder. The first decoder detects a control signal (Sig_first), and decodes a first bin representing one of a first coefficient flag (Sig) and a second coefficient flag (Last) from the bitstream according to the control signal (Sig_first). The second decoder detects the control signal (Sig_first), decodes a second bin representing one of the second coefficient flag (Last) and a next first coefficient flag (Sig) from the bitstream according to the decoded first bin and the control signal (Sig_first) and updates the control signal (Sig_first) according to the decoded first and second bins. Noted that the first and second bins are decoded in one clock cycle, the first coefficient flag (Sig) indicates whether a corresponding coefficient value is zero, and the second coefficient flag (Last) indicates whether a coefficient map decoding process is finished.

A context-based adaptive binary arithmetic coding (CABAC) decoding method for a bitstream is further provided. The CABAC decoding method comprises detecting a control signal (Sig_first); decoding at least two bins from the bitstream in response to the control signal (Sig_first) in one clock cycle; and determining at least one decoded bin to be one of a first coefficient flag (Sig) and a second coefficient flag (Last) according to the control signal (Sig_first). It is noted that the first coefficient flag (Sig) indicates whether a corresponding coefficient value is zero, and the second coefficient flag (Last) indicates whether a coefficient map decoding process is finished.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

With regard to the decoding of the H.264 CABAC specification, a CABAC decoding unit receives and decodes a bitstream to generate a stream of bins. The syntax value can be interpreted by decoding the stream of bins according the binarization method related to the syntax element. In H.264/AVC video standard, three syntax elements are utilized in coding block residual, including a first coefficient flag (significant_coeff_flag, Sig), a second coefficient flag (last_significant_coeff_flag, Last) and a corresponding coefficient value. Each syntax element: the first coefficient flag (Sig), the second coefficient flag (Last) and the corresponding coefficient value, respectively presents different functions or meanings. For example, first coefficient flag (Sig) represents whether the corresponding coefficient value is equal to zero. When the first coefficient flag (Sig) is one, the corresponding coefficient value is not a zero number; otherwise, the corresponding coefficient value is zero when the first coefficient flag (Sig) is zero. When the second coefficient flag (Last) is one, it means that the coefficient map decoding process in CABAC decoding operation is finished. Conversely, when the second coefficient flag (Last) is zero, the coefficient map decoding process is not finished.

The process of decoding the first coefficient flag (significant_coeff_flag, Sig) and the second coefficient flag (last_significant_coeff_flag, Last) accounts for a great part of the workload of CABAC decoding operation because there are at most 15 pairs of them for each 4×4 block, where there are at most twenty-four 4×4 blocks in one macroblock (MB) in 4:2:0 video format. Conventionally, if the first coefficient flag (Sig) is 0, the CABAC decoding unit only decodes one bin during one clock cycle during the coefficient map decoding process. Thus, the CABAC decoding unit can not efficiently decode two or more flags simultaneously, such as two first coefficient flags (Sig), or one first coefficient flag (Sig) and one second coefficient flag (Last).

Figure 1:
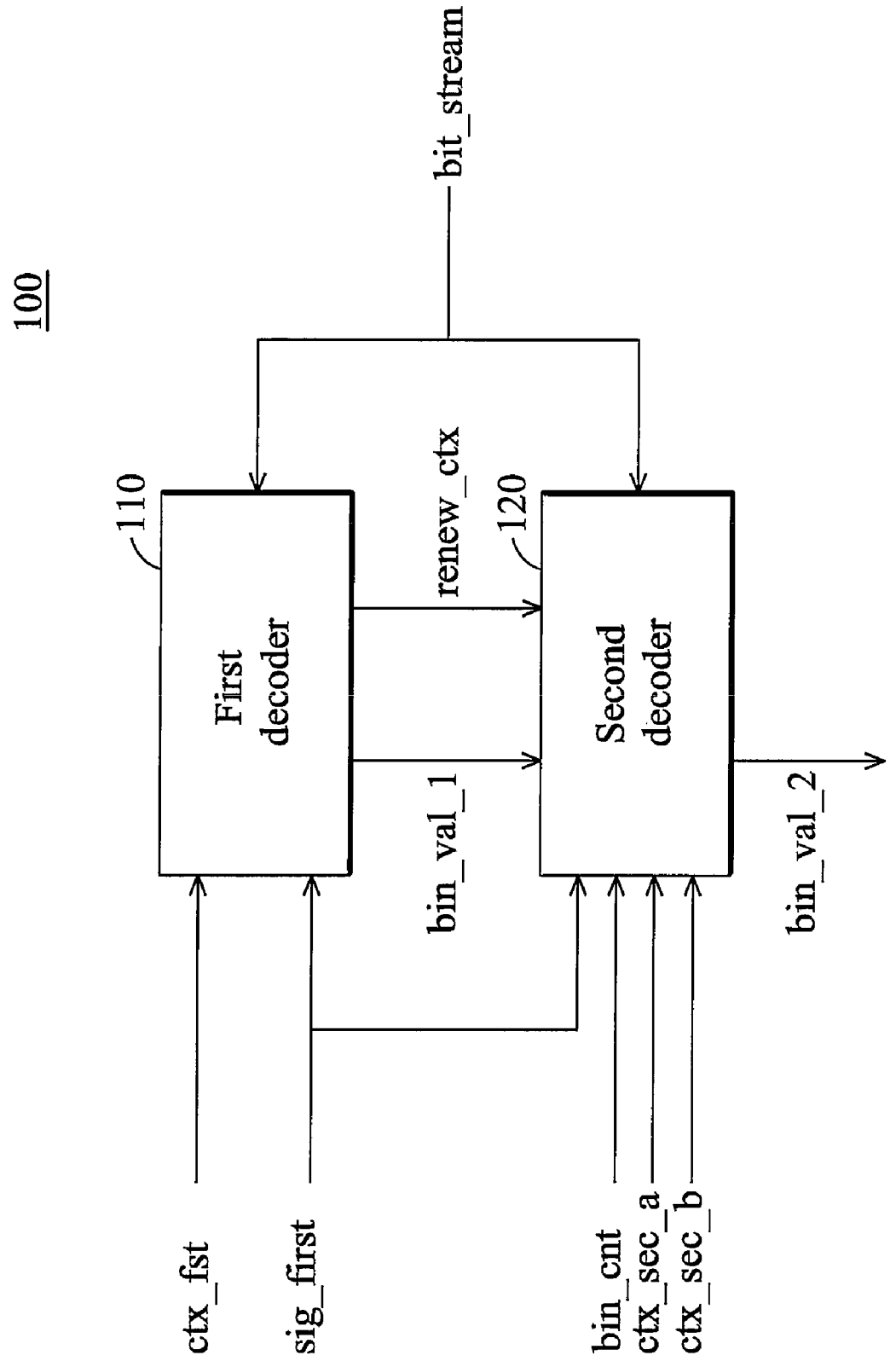
FIG. 1 is a schematic block diagram of a CABAC decoding unit according to an embodiment of the invention.

FIG. 1 is a schematic block diagram of a CABAC decoding unit 100 according to an embodiment of the invention. The CABAC decoding unit 100 comprises the first decoder 110 and the second decoder 120 for coefficient map decoding process. The first decoder 110 receives a bitstream and detects a control signal Sig_first. The first decoder 110 further decodes a first bin representing one of the first coefficient flag (Sig) and the second coefficient flag (Last) according to the control signal Sig_first to generate a first bin value bin_val_1 of the first bin. More specifically, the first decoder 110 determines the first bin corresponding to the first or second coefficient flags (Sig or Last) according to the control signal Sig_first and generates the first bin value bin_val_1 for the first bin with a context model selected in accordance with a context control signal ctx_fst. In an embodiment of the invention, when the control signal (Sig_first) is equal to one, the first decoder 110 decodes the first bin from the bitstream according to the context control signal ctx_fst and determines the first bin to be the first coefficient flag (Sig) which indicates whether the corresponding coefficient value is zero. Conversely, when the control signal (Sig_first) is equal to zero, the first decoder 110 decodes the first bin from the bitstream according to the context control signal ctx_fst and determines the first bin to be the second coefficient flag (Last) indicating whether the coefficient map decoding process of CABAC decoding operation is finished. The second decoder 120 receives the bitstream and the first bin value bin_val_1 and a context selecting signal renew_ctx from the first decoder 110. The second decoder 120 further decodes a second bin representing one of the second coefficient flag (Last) or a next first coefficient flag (Sig) according to the control signal Sig_first and the first bin value bin_val_1 to generate a second bin value bin_val_2 for the second bin. More specifically, the second decoder 120 determines the second bin corresponding to the next first coefficient flag (Sig) or the second coefficient flag (Last) according to the control signal Sig_first and the first bin value bin_val_1 and generates the second bin value bin_val_2 with a context model selected in accordance with context selecting signals renew_ctx, ctx_sec_a, and ctx_sec_b. Thus, the second decoder 120 decodes the next first coefficient flag (Sig) from the bitstream to indicate whether a corresponding coefficient value is equal to zero and generates the second bin value bin_val_2 for the second bin accordingly. Otherwise, the second decoder 120 decodes the second coefficient flag (Last) from the bitstream to detect whether the coefficient map decoding process of CABAC decoding operation is finished, and generates the second bin value bin_val_2 for the second bin. The second decoder 120 further updates the control signal (Sig_first) for a next cycle accordingly. Moreover, it is noted that the first and second bins are decoded in one clock cycle.

In short, the first coefficient flag (Sig) or the second coefficient flag (Last) is decoded by the first decoder 110 from the bitstream according to the context control signal ctx_fst and the control signal Sig_first to generate the first bin value bin_val_1. In response to the first bin value bin_val_1 and the control signal Sig_first, the next first coefficient flag (Sig) or the second coefficient flag (Last) decoded by the second decoder 120 from the bitstream is also generated according to at least one context selecting signal (renew_ctx, ctx_sec_a, and ctx_sec_b) to generate the second bin value bin_val_2.

The operation of the first decoder 110 and second decoder 120 in the CABAC decoding unit 100 are described as follows. According to an embodiment of the invention, when the control signal (Sig_first) is 1 and the first coefficient flag (Sig) decoded by the first decoder 110 is also 1, the second decoder 120 decodes the second coefficient flag (Last). When the decoded second coefficient flag (Last) is 1, the coefficient map decoding process is finished (case 1). Conversely, when the decoded second coefficient flag (Last) is 0, the control signal (Sig_first) for the next cycle is 1 (case 2).

According to another embodiment of the invention, when the control signal (Sig_first) is 1 and the first coefficient flag (Sig) decoded by the first decoder 110 is 0, the second decoder 120 decodes a next first coefficient flag (Sig). When the next first coefficient flag (Sig) is 1, the control signal (Sig_first) for the next cycle is 0 (case 3). Conversely, when the next first coefficient flag (Sig) is 0, the control signal (Sig_first) for the next cycle is 1 (case 4).

According to another embodiment of the invention, when the control signal (Sig_first) is 0 and the second coefficient flag (Last) decoded by the first decoder 110 is 1, the coefficient map decoding process is finished (case 5).

According to another embodiment of the invention, when the control signal (Sig_first) is 0 and the second coefficient flag (Last) decoded by the first decoder 110 is 0, the second decoder 120 decodes the next first coefficient flag (Sig). When the decoded next first coefficient flag (Sig) is 1, the control signal (Sig_first) for the next cycle is 0 (case 6). In contrast, when the decoded next first coefficient flag (Sig) is 0, the control signal (Sig_first) for the next cycle is 1 (case 7). Table 1 shows the summary of cases 1-7 described above.

TABLE 1

| (Sig_first = 1) | (Case 1) | syntax: | Sig | Last | next cycle |
|---|---|---|---|---|---|
| | | bin_val: | 1 | 1 | →decoding end |
| | (Case 2) | syntax: | Sig | Last | next cycle |
| | | bin_val: | 1 | 0 | →Sig_first = 1 |
| | Case (3) | syntax: | Sig | Sig | next cycle |
| | | bin_val: | 0 | 1 | →Sig_first = 0 |
| | (Case 4) | syntax: | Sig | Sig | next cycle |
| | | bin_val: | 0 | 0 | →Sig_first = 1 |

TABLE 1-continued

| (Sig_first = 0) | (Case 5) | syntax:<br>bin_val: | Last<br>1 | X | next cycle<br>→decoding end |
|---|---|---|---|---|---|
| | (Case 6) | syntax:<br>bin_val: | Last<br>0 | Sig<br>1 | next cycle<br>→Sig_first = 0 |
| | (Case 7) | syntax:<br>bin_val: | Last<br>0 | Sig<br>0 | next cycle<br>→Sig_first = 1 |

It is noted that the first decoder 110 and the second decoder 120 decode at least one first coefficient flag (Sig) and one second coefficient flag (Last), or two first coefficient flags (Sig) during one clock cycle unless the second coefficient flag (Last) is one, indicating the coefficient map decoding process is finished. Therefore, the decoders 110 and 120 would not be at idle state when the received first coefficient flag (Sig) is zero. The decoders 110 and 120 respectively decode at least one coefficient flag, such as the first coefficient flag (Sig) and the second coefficient flag (Last), during one clock cycle. Thus, the first decoder 110 and the second decoder 120 decode the first coefficient flag (Sig) and the second coefficient flag (Last) more efficiently without wasting a clock cycle. The decoding speed increases significantly and the probability decoding delay is reduced. Moreover, the level of the control signal Sig_first may be adjusted as long as the first and second decoders 110 and 120 are able to determine the first bin and second bin to be the first coefficient flag (Sig) or the second coefficient flag (Last) in response thereto. This is known in the art and thus not further described.

Figure 2:
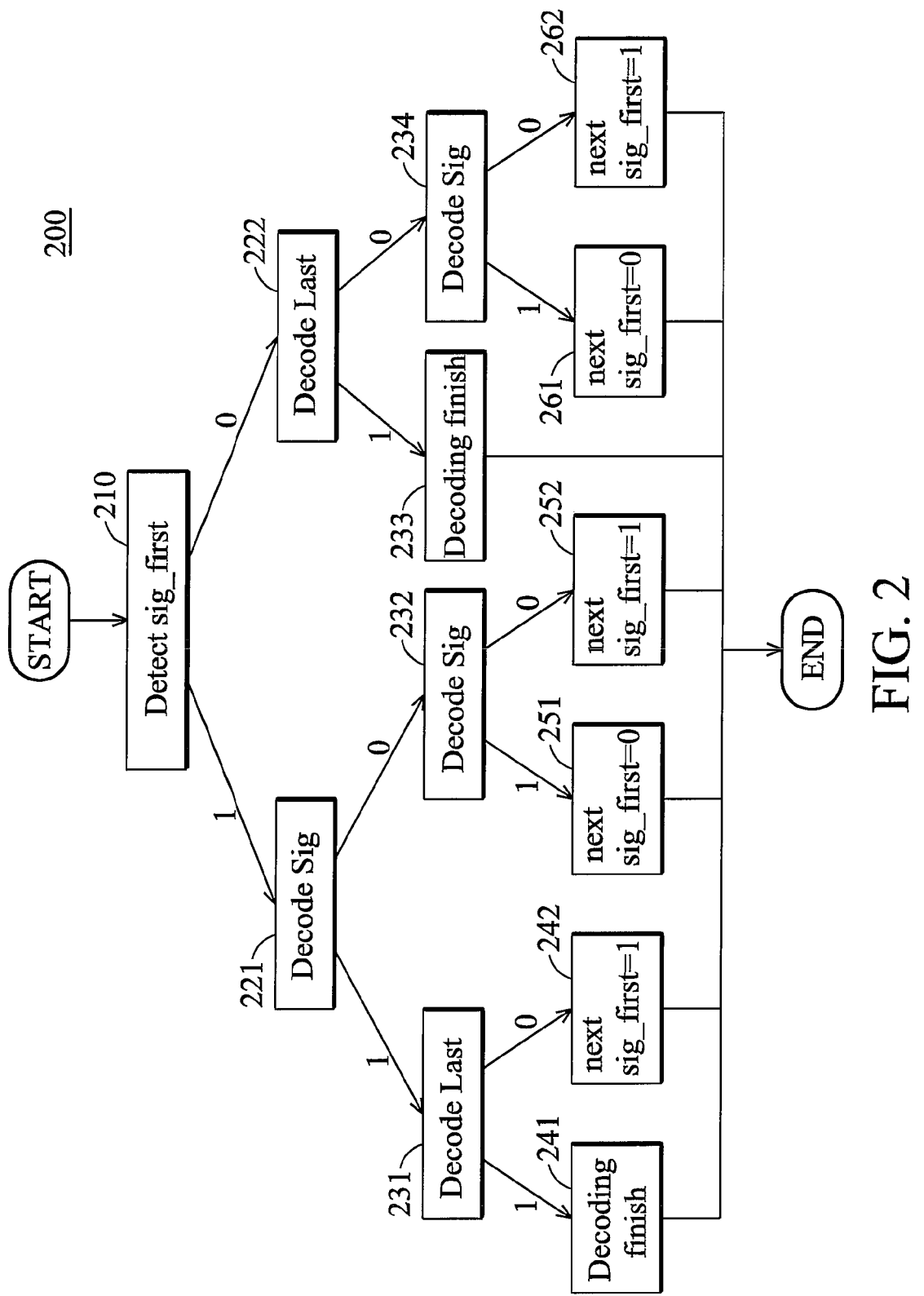
FIG. 2 is a flow chart of decoding method according to another embodiment of the invention.

FIG. 2 is a flow chart of a CABAC decoding method 200 according to another embodiment of the invention. The control signal (Sig_first) is detected by the first decoder 110 and the second decoder 120 (step 210).

According to an embodiment of the invention, when the control signal (Sig_first) is detected as one in step 210, the first decoder decodes a first bin representing the first coefficient flag (Sig) indicating whether a corresponding coefficient value is zero (step 221). If the first coefficient flag (Sig) is decoded first in step 221, the method 200 proceeds to steps 241, 242, 251 and 252 which are respectively corresponding to the cases 1, 2, 3 and 4.

When the control signal (Sig_first) is one and the first coefficient flag (Sig) decoded in step 221 is one, the second decoder 120 decodes a second bin representing the second coefficient flag (Last) (step 231). When the second coefficient flag (Last) decoded by second decoder 120 is one in step 231, the coefficient map decoding process is finished (step 241, case 1). When the second coefficient flag (Last) decoded by second decoder 120 is zero in step 231, a next control signal (Sig_first) is updated as one for the next cycle by the second decoder 120 (step 242, above case 2).

When the control signal (Sig_first) is one and the first bin representing the first coefficient flag (Sig) and decoded in step 221 is zero, the second decoder 120 decodes the second bin representing a next first coefficient flag (Sig) (step 232). After decoding the next first coefficient flag (Sig) in step 232, if the decoded next first coefficient flag (Sig) is one, a next control signal (Sig_first) is updated as zero for the next cycle (step 251, case 3). When the next first coefficient flag (Sig) decoded in step 232 is zero, the control signal (Sig_first) is updated as one for the next cycle by the second decoder 120 (step 252, case 4).

According to another embodiment of the invention, when the control signal (Sig_first) is detected as zero in step 210, the first decoder 110 decodes the first bin representing the second coefficient flag (Last) indicating whether a coefficient map decoding process is finished (step 222). If the second coefficient flag (Last) is decoded first, the method 200 proceeds to steps 233, 261 and 262 which are respectively corresponding to the cases 5, 6 and 7.

When the control signal (Sig_first) is zero and the second coefficient flag (Last) decoded by the first decoder 110 is one in step 222, the coefficient map decoding process is finished (step 233, case 5).

When the control signal (Sig_first) is zero and the first bin representing the second coefficient flag (Last) and decoded by the first decoder 110 in step 222 is zero, the second decoder 120 decodes the second bin representing the next first coefficient flag (Sig) (step 234).

When the second bin representing the next first coefficient flag (Sig) and decoded by the second decoder 120 in step 234 is one, the control signal (Sig_first) is updated as zero for the next cycle by the second decoder 120 (step 261, case 6). Conversely, when the second bin representing the next first coefficient flag (Sig) and decoded by the second decoder 120 in step 234 is zero, the control signal (Sig_first) is updated as one for the next cycle by the second decoder 120 (step 262, case 7).

In sum, the first decoder 110 and the second decoder 120 are not at idle state when receiving the first coefficient flag (Sig) as zero. The first decoder 110 and the second decoder 120 respectively decode at least one coefficient flag every clock cycle. Thus, the first decoder 110 and the second decoder 120 decode the first coefficient flag (Sig) and the second coefficient flag (Last) to generate the first bin value bin_val_1 and the second bin value bin_val_2 more efficiently because every clock cycle is fully utilized.

Figure 3:
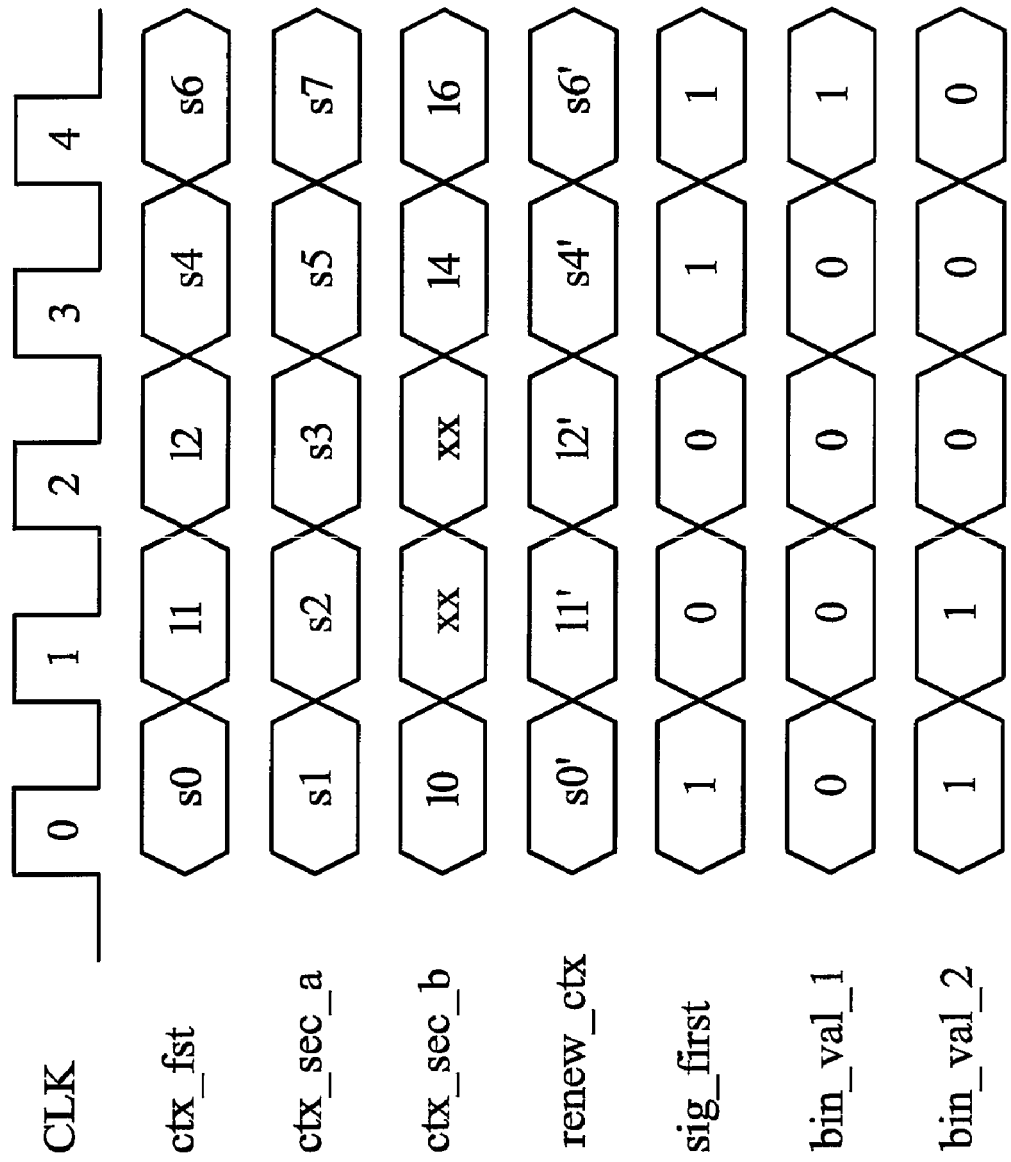
FIG. 3 shows a timing diagram explaining the operation of the CABAC decoding unit of FIG. 1 according to another embodiment of the invention.

FIG. 3 shows a timing diagram with a clock signal CLK, the context control signal ctx_fst, the context selecting signals renew_ctx, ctx_sec_a and ctx_sec_b, bin values (signals) bin_val_1 and bin_val_2, the control signal sig_first according to another embodiment of the invention. FIG. 3 has shown each signal in each clock cycle being different numbers or modes. In clock cycle 0, the CABAC decoding unit 100 starts to decode coefficient flags (Sig & Last). As shown in FIG. 3, the control signal sig_first=1, the context control signal ctx_fst=s0, the context selecting signals renew_ctx=s0', ctx_sec_a=s1 and ctx_sec_b=10, and the first decoder 110 decodes the first bin from the bitstream according to the control signal sig_first and the context control signal ctx_fst to generate the first bin value bin_val_1 in clock cycle 0. As shown in FIG. 3, since the control signal sig_first=1 and the bin value bin_val_1=0 in clock cycle 0, it presents the first coefficient flag sig [0]=0. It also indicates that the second decoder 120 will decode the next first coefficient flag sig [1] in clock cycle 0 from the bitstream since the control signal sig_first=1 and the first coefficient flag Sig [0]=0 and generate the second bin value bin_val_2 with a context model selected in accordance with context selecting signals renew_ctx, ctx_sec_a, and ctx_sec_b. As shown in FIG. 3, the second bin value bin_val_2=1, it presents the next first coefficient flag Sig [1]=1. And, the control signal sig_first in clock cycle 1 will be 0. With regard to the clock cycles 1, 2, 3, and 4, since the conditions are similar to the above description, the corresponding description is not repeated herein.

Figure 4:
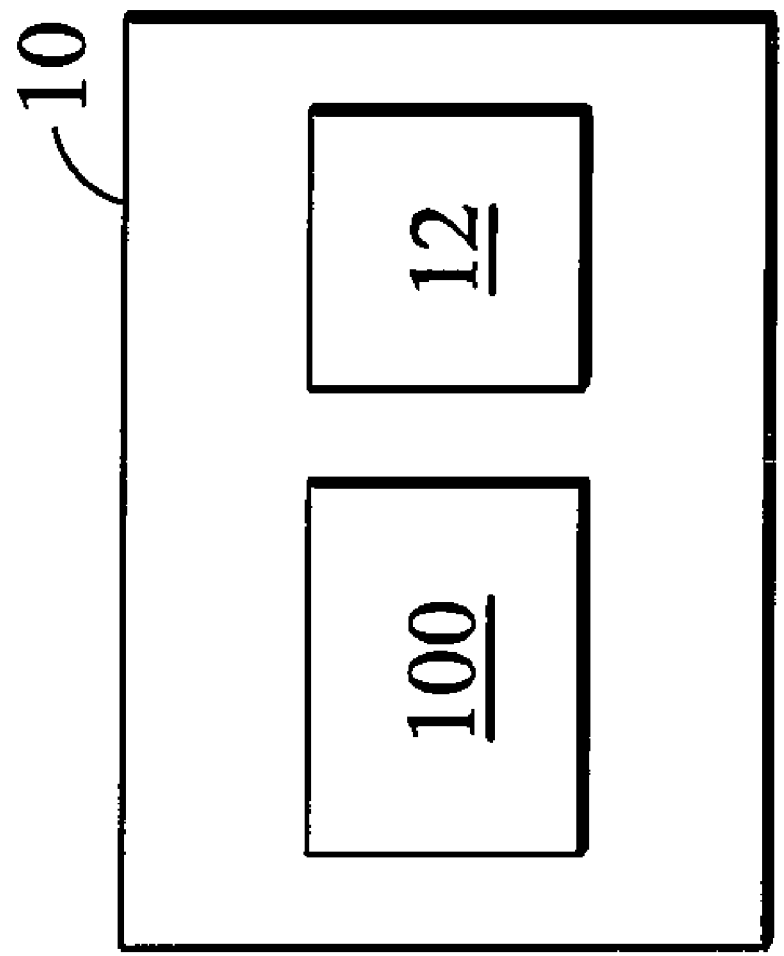
FIG. 4 shows an electrical system according to another embodiment of the invention.

FIG. 4 shows an electrical system 10 according to another embodiment of the invention. The electrical system 10 for display images comprises the CABAC decoding unit 100, control unit 12 and so on . . . . The electronic system 10 can be a mobile phone, digital camera, PDA (personal data assistant), notebook computer, desktop computer, television, or portable DVD player, for example. However, it is not limited that the electrical system 10 is the above devices.

While the invention has been described by way of example and in terms of preferred embodiment, it is to be understood that the invention is not limited to thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A context-based adaptive binary arithmetic coding (CABAC) decoding method for a bitstream, comprising:
    detecting a control signal (Sig_first);
    decoding a first bin representing one of a first coefficient flag (Sig) and a second coefficient flag (Last) from the bitstream according to the control signal (Sig_first);
    decoding a second bin representing one of the second coefficient flag (Last) and a next first coefficient flag (Sig) from the bitstream according to the decoded first bin and the control signal (Sig_first); and
    updating the control signal (Sig_first) according to the decoded first and second bins,
    wherein the first and second bins are decoded in one clock cycle, the first coefficient flag (Sig) indicates whether a corresponding coefficient value is zero, and the second coefficient flag (Last) indicates whether a coefficient map decoding process is finished.

2. The CABAC decoding method as claimed in claim 1, wherein if the first bin represents the first coefficient flag (Sig), the second bin represents the second coefficient flag (Last) when the corresponding coefficient value indicated by the first coefficient flag (Sig) is not equal to zero.

3. The CABAC decoding method as claimed in claim 1, wherein if the first bin represents the first coefficient flag (Sig), the second bin represents the next first coefficient flag (Sig) when the corresponding coefficient value indicated by the first coefficient flag (Sig) is equal to zero.

4. The CABAC decoding method as claimed in claim 1, wherein if the first bin represents the second coefficient flag (Last), the second bin represents the next first coefficient flag (Sig) when the second coefficient flag (Last) of the first bin indicates the coefficient map decoding process is not finished.

5. The CABAC decoding method as claimed in claim 1, wherein if the second bin represents the second coefficient flag (Last) and indicates the coefficient map decoding process is not finished, updating the control signal (Sig_first) further comprising updating the control signal (Sig_first) so that a first bin decoded in a next clock cycle represents the next first coefficient flag (Sig).

6. The CABAC decoding method as claimed in claim 1, wherein if the second bin represents the next first coefficient flag (Sig) and indicates the corresponding coefficient value is equal to zero, updating the control signal (Sig_first) further comprising updating the control signal (Sig_first) so that a first bin decoded in a next clock cycle represents the next first coefficient flag (Sig).

7. The CABAC decoding method as claimed in claim 1, wherein if the second bin represents the next first coefficient flag (Sig) and indicates the corresponding coefficient value is not equal to zero, updating the control signal (Sig_first) further comprising updating the control signal (Sig_first) so that a first bin decoded in a next clock cycle represents a next second coefficient flag (Last).

8. The CABAC decoding method as claimed in claim 1, wherein decoding the first bin comprising:
    selecting a first context model to decode the first bin therewith; and
    determining the first bin to be the first coefficient flag (Sig) or the second coefficient flag (Last) according to the control signal (Sig_first).

9. The CABAC decoding method as claimed in claim 1, wherein decoding the second bin comprising:
    selecting a second context model to decode the second bin therewith; and
    determining the second bin to be the second coefficient flag (Last) or the next first coefficient flag (Sig) according to the control signal (Sig_first) and the first bin.

10. The CABAC decoding method as claimed in claim 1, wherein at least one first coefficient flag (Sig) and one second coefficient flag (Last) or at least two first coefficient flags (Sig) are decoded in one clock cycle.

11. A context-based adaptive binary arithmetic coding (CABAC) decoding unit for a bitstream, comprising
    a first decoder detecting a control signal (Sig_first), and decoding a first bin representing one of a first coefficient flag (Sig) and a second coefficient flag (Last) from the bitstream according to the control signal (Sig_first); and
    a second decoder coupled to the first decoder, decoding a second bin representing one of the second coefficient flag (Last) and a next first coefficient flag (Sig) from the bitstream according to the decoded first bin and the control signal (Sig_first) and updating the control signal (Sig_first) according to the decoded first and second bins,
    wherein the first and second bins are decoded in one clock cycle, the first coefficient flag (Sig) indicates whether a corresponding coefficient value is zero, and the second coefficient flag (Last) indicates whether a coefficient map decoding process is finished.

12. The CABAC decoding unit as claimed in claim 11, wherein if the first bin represents the first coefficient flag (Sig), the second bin represents the second coefficient flag (Last) when the corresponding coefficient value indicated by the first coefficient flag (Sig) is not equal to zero.

13. The CABAC decoding unit as claimed in claim 11, wherein if the first bin represents the first coefficient flag (Sig), the second bin represents the next first coefficient flag (Sig) when the corresponding coefficient value indicated by the first coefficient flag (Sig) is equal to zero.

14. The CABAC decoding unit as claimed in claim 11, wherein if the first bin represents the second coefficient flag (Last), the second bin represents the next first coefficient flag (Sig) when the second coefficient flag (Last) of the first bin indicates the coefficient map decoding process is not finished.

15. The CABAC decoding unit as claimed in claim 11, wherein if the second bin represents the second coefficient flag (Last) and indicates the coefficient map decoding process is not finished, the second decoder updates the control signal (Sig_first) so that a first bin decoded in a next clock cycle represents the next first coefficient flag (Sig).

16. The CABAC decoding unit as claimed in claim 11, wherein if the second bin represents the next first coefficient flag (Sig) and indicates the corresponding coefficient value is equal to zero, the second decoder updates the control signal (Sig_first) so that a first bin decoded in a next clock cycle represents the next first coefficient flag (Sig).

17. The CABAC decoding unit as claimed in claim 11, wherein if the second bin represents the next first coefficient flag (Sig) and indicates the corresponding coefficient value is not equal to zero, the second decoder updates the control signal (Sig_first) so that a first bin decoded in a next clock cycle represents a next second coefficient flag (Last).

18. The CABAC decoding unit as claimed in claim 11, wherein the first decoder decodes the first bin by selecting a first context model to decode the first bin therewith and determining the first bin to be the first coefficient flag (Sig) or the second coefficient flag (Last) according to the control signal (Sig_first).

19. The CABAC decoding unit as claimed in claim 11, wherein the second decoder decodes the second bin by selecting a second context model to decode the second bin therewith and determining the second bin to be the second coefficient flag (Last) or the next first coefficient flag (Sig) according to the control signal (Sig_first) and the first bin.

20. The CABAC decoding unit as claimed in claim 11, wherein at least one first coefficient flag (Sig) and one second coefficient flag (Last) or at least two first coefficient flags (Sig) are decoded in one clock cycle.

21. A context-based adaptive binary arithmetic coding (CABAC) decoding method for a bitstream, comprising:
    detecting a control signal (Sig_first);
    decoding at least two bins from the bitstream in response to the control signal (Sig_first) in one clock cycle; and
    determining at least one decoded bin to be one of a first coefficient flag (Sig) and a second coefficient flag (Last) according to the control signal (Sig_first);
    wherein the first coefficient flag (Sig) indicates whether a corresponding coefficient value is zero, and the second coefficient flag (Last) indicates whether a coefficient map decoding process is finished.

\* \* \* \* \*